United States Patent
Lin et al.

(10) Patent No.: US 9,520,353 B2
(45) Date of Patent: Dec. 13, 2016

(54) METAL-INSULATION-METAL DEVICE

(71) Applicant: HIMAX TECHNOLOGIES LIMITED, Tainan (TW)

(72) Inventors: Hung-Sui Lin, Tainan (TW); Mao-Hsiung Lin, Tainan (TW)

(73) Assignee: HIMAX TECHNOLOGIES LIMITED, Tainan (TW)

( * ) Notice: Subject to any disclaimer, the term of this patent is extended or adjusted under 35 U.S.C. 154(b) by 0 days.

(21) Appl. No.: 14/710,243

(22) Filed: May 12, 2015

(65) Prior Publication Data

US 2015/0243728 A1  Aug. 27, 2015

Related U.S. Application Data

(62) Division of application No. 13/196,211, filed on Aug. 2, 2011, now Pat. No. 9,059,192.

(60) Provisional application No. 61/470,508, filed on Apr. 1, 2011.

(51) Int. Cl.
  *H01L 29/00* (2006.01)
  *H01L 23/522* (2006.01)
  *H01L 49/02* (2006.01)

(52) U.S. Cl.
  CPC ....... *H01L 23/5222* (2013.01); *H01L 23/5223* (2013.01); *H01L 28/60* (2013.01); *H01L 2924/0002* (2013.01)

(58) Field of Classification Search
  CPC .. H01L 23/5222; H01L 23/5223; H01L 28/55; H01L 28/60; H01L 28/40

USPC .......................................................... 257/532
See application file for complete search history.

(56) References Cited

U.S. PATENT DOCUMENTS

| | | | | |
|---|---|---|---|---|
| 6,576,526 | B2* | 6/2003 | Kai ................... | H01L 21/31122 257/E21.009 |
| 2001/0009788 | A1* | 7/2001 | Lipkin .................. | H01L 21/045 438/285 |
| 2002/0179951 | A1* | 12/2002 | Yoshiyama ....... | H01L 21/76838 257/303 |
| 2005/0269663 | A1* | 12/2005 | Minami .............. | H01L 27/0629 257/510 |
| 2009/0134493 | A1* | 5/2009 | Iwaki ...................... | H01L 28/55 257/532 |
| 2010/0213572 | A1* | 8/2010 | Ching ................. | H01L 23/5223 257/532 |
| 2011/0121908 | A1* | 5/2011 | Inaba ................... | H03H 3/0073 331/116 FE |

* cited by examiner

*Primary Examiner* — Jerome Jackson, Jr.
*Assistant Examiner* — Paul Budd
(74) *Attorney, Agent, or Firm* — J.C. Patents

(57) ABSTRACT

A metal-insulation-metal (MIM) device including a first metal layer, a first insulation layer, a second metal layer, and a second insulation layer is provided. The first insulation layer is disposed on the first metal layer. The second metal layer is disposed on a part of the first insulation layer. The second insulation layer is disposed on a side wall of the second metal layer and on another part of the first insulation layer. A width of the first insulation layer under the second metal layer and the second insulation layer parallel to the first metal layer is greater than a with of the second metal layer parallel to the first metal layer.

4 Claims, 3 Drawing Sheets

METAL-INSULATION-METAL DEVICE

CROSS-REFERENCE TO RELATED APPLICATION

This application is a divisional application of and claims the priority benefit of U.S. application Ser. No. 13/196,211, filed on Aug. 2, 2011, now allowed. The prior U.S. application Ser. No. 13/196,211 claims the priority benefit of U.S. Provisional Application Ser. No. 61/470,508, filed on Apr. 1, 2011. The entirety of each of the above-mentioned patent applications is hereby incorporated by reference herein and made a part of this specification.

BACKGROUND OF THE INVENTION

1. Field of the Invention

The invention generally relates to an electronic device and a manufacture method thereof and, in particular, to a metal-insulation-metal (MIM) device and a manufacture method thereof.

2. Description of Related Art

Nowadays, many electronic devices are usually integrated in a chip, especially for portable electronic apparatuses, for example, cellular phones, notebook personal computers (PCs), tablet PCs, personal digital assistants (PDAs), and digital cameras, and for some multi-function electronic apparatuses, for example, desktop PCs, DVD players, projectors, audio players, video game consoles, and multi-function washing machines. As a result, the volumes of the electronic apparatuses can be reduced and the response speed of the electronic apparatuses can be increased. Therefore, the electronic apparatuses can deal with more things for people, which greatly changes people's life style.

With the progress of the electronic technology, electronic devices are made smaller and smaller, which increases the number of the electronic devices in a unit area. In this way, a chip with the same area can achieve better performance, or the volume of the electronic apparatus can be reduced.

However, when the electronic devices are made smaller and smaller, many new problems occur. For example, when the volume of an MIM capacitor is reduced, the conductive path between two metal layers is shortened, so that a leakage current between the two metal layers is increased. As a result, the MIM capacitor is not suitable for operating in a high voltage.

SUMMARY OF THE INVENTION

Accordingly, the invention is directed to a manufacture method of a metal-insulation-metal (MIM) device, which reduces the leakage current in the MIM device.

The invention is directed to an MIM device, which has better performance.

An embodiment of the invention provides a manufacture method of a metal-insulation-metal (MIM) device. The manufacture method includes following steps. A first metal layer is provided. A first insulation layer is formed on the first metal layer. A second metal layer is formed on the first insulation layer. A part of the second metal layer is etched, wherein a remaining part of the second metal layer is not etched. A second insulation layer covering the remaining part of the second metal layer and the first insulation layer is formed. The second insulation layer is etched and a residual part of the second insulation layer is maintained on a side wall of the remaining part of the second metal layer. The first insulation layer is etched, wherein an intermediate part of the first insulation layer under the remaining part of the second metal layer and the residual part of the second insulation layer is not etched due to the remaining part of the second metal layer and the residual part of the second insulation layer serving as an etching barrier. A width of the intermediate part of the first insulation layer parallel to the first metal layer is greater than a width of the remaining part of the second metal layer parallel to the first metal layer.

Another embodiment of the invention provides an MIM device including a first metal layer, a first insulation layer, a second metal layer, and a second insulation layer. The first insulation layer is disposed on the first metal layer. The second metal layer is disposed on a part of the first insulation layer. The second insulation layer is disposed on a side wall of the second metal layer and on another part of the first insulation layer. A width of the first insulation layer under the second metal layer and the second insulation layer parallel to the first metal layer is greater than a with of the second metal layer parallel to the first metal layer.

In the manufacture method of the MIM device according to the embodiment of the invention, since the residual part of the second insulation layer is maintained on a side wall of the remaining part of the second metal layer, and since the width of the intermediate part of the first insulation layer parallel to the first metal layer is greater than the width of the remaining part of the second metal layer parallel to the first metal layer, the leakage current from the edge of the remaining part of the second metal layer is effectively reduced, thus increasing the performance of the MIM device. In the MIM device according to the embodiment of the invention, since the second insulation layer is disposed on a side wall of the second metal layer, and since the width of the first insulation layer under the second metal layer and the second insulation layer parallel to the first metal layer is greater than the width of the second metal layer parallel to the first metal layer, the leakage current from the edge of the second metal layer is effectively reduced, thus increasing the performance of the MIM device.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
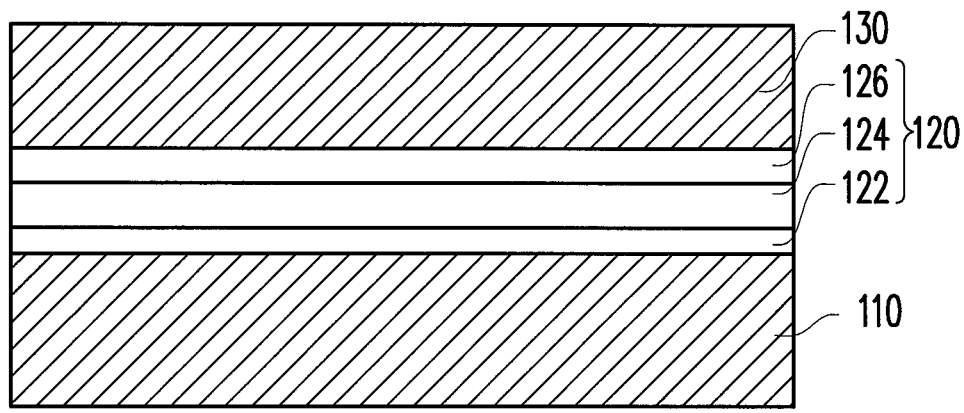
FIGS. 1 through 6 are schematic cross-sectional views showing steps of a manufacture method of an MIM device according to an embodiment of the invention.

Reference will now be made in detail to the preferred embodiments of the invention, examples of which are illustrated in the accompanying drawings. Wherever possible, the same reference numbers are used in the drawings and the description to refer to the same or like parts.

FIGS. 1 through 6 are schematic cross-sectional views showing steps of a manufacture method of an MIM device according to an embodiment of the invention. Referring to FIGS. 1 through 6, the manufacture method of the MIM device according to this embodiment includes following steps. First, referring to FIG. 1, a first metal layer 110 is provided. For example, the first metal layer 110 is formed on a substrate, such as a silicon substrate. Specifically, the first metal layer 110 may be deposited on the substrate by physical vapor deposition (PVD) or chemical vapour deposition (CVD). In this embodiment, the first metal layer 110 is an electrically conductive layer. Then, a first insulation layer 120 (i.e. a dielectric layer) is formed on the first metal layer 110. In this embodiment, the first insulation layer 120 includes a silicon dioxide sub-layer 122, a silicon nitride sub-layer 124, and a silicon dioxide sub-layer 126 formed on the first metal layer 110 in sequence. However, in another embodiment, the first insulation layer 120 may also be a single insulation layer. The first insulation layer 120 may be deposited on the first metal layer 110 by PVD or CVD. After that, a second metal layer 130 is formed on the first insulation layer 120. The second metal layer 130 may be deposited on the first insulation layer 120 by PVD or CVD. In this embodiment, the material of the second metal layer 130 includes aluminium, titanium nitride, or the combination thereof.

Figure 2:
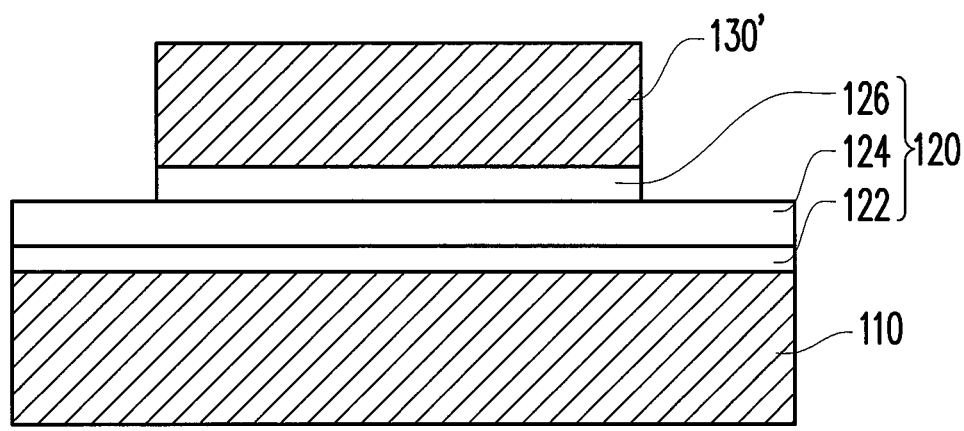

Next, referring to FIG. 2, a part of the second metal layer 130 is etched, wherein a remaining part 130' of the second metal layer 130 is not etched. In this embodiment, the etching of the part of the second metal layer 130 may be performed by using a mask, for example, by using photolithograpy. In this embodiment, after etching the part of the second metal layer 130, a top portion of the first insulation layer 120 not covered by the remaining part 130' of the second metal layer 130 is over-etched. For example, a part of the silicon dioxide sub-layer 126 is etched.

Figure 3:
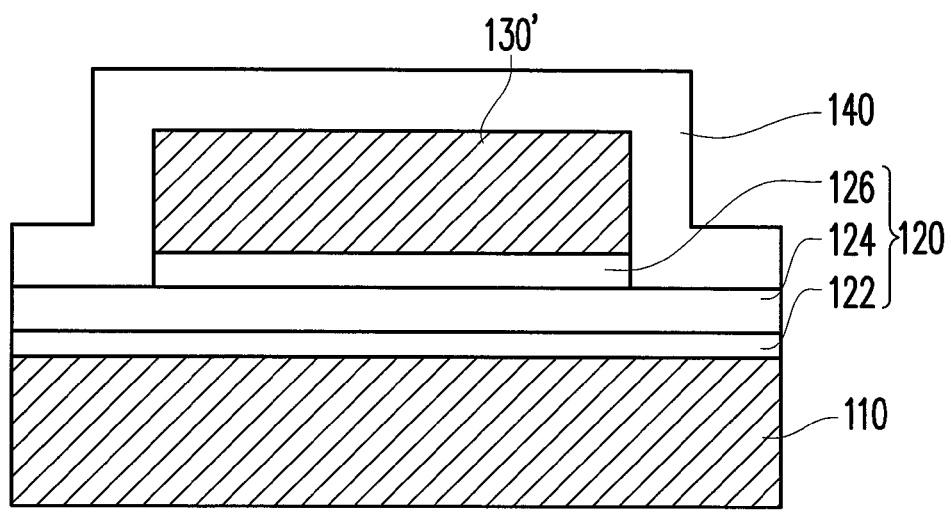

Afterwards, referring to FIG. 3, a second insulation layer 140 covering the remaining part 130' of the second metal layer 130 and the first insulation layer 120 is formed. For example, the second insulation layer 140 is deposited by PVD or CVD. In this embodiment, the second insulation layer 140 is, for example, a silicon dioxide layer. However, in another embodiment, the material of the second insulation layer 140 may be another appropriate insulation material. In this embodiment, the step of forming the second insulation layer 140 is, for example, blanket formation of the second insulation layer 140 on the remaining part 130' of the second metal layer 130 and the first insulation layer 120.

Figure 4:
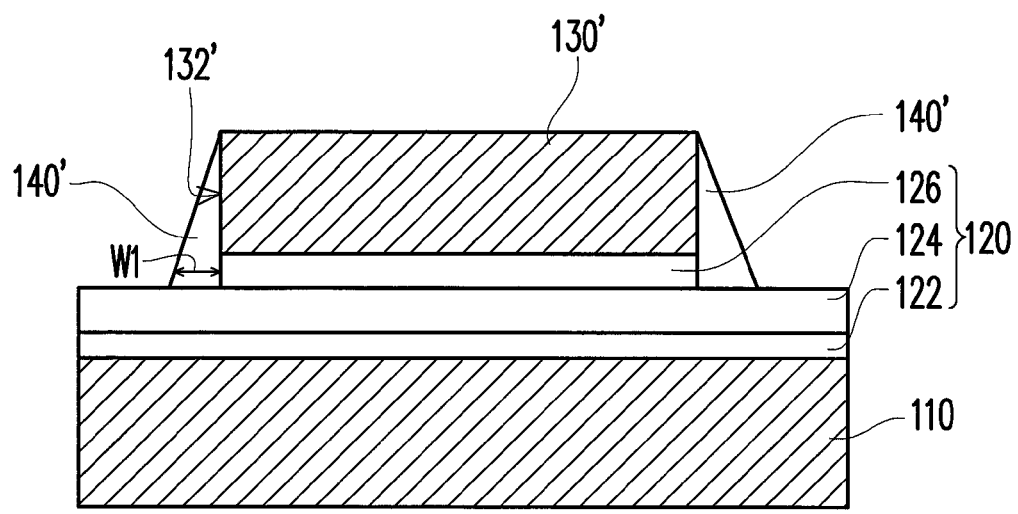

Then, referring to FIG. 4, the second insulation layer 140 is etched and a residual part 140' of the second insulation layer 140 is maintained on a side wall 132' of the remaining part 130' of the second metal layer 130. In this embodiment, the step of etching the second insulation layer 140 and maintaining the residual part 140' of the second insulation layer 140 is a blanket etching (i.e. not using a mask), and the residual part 140' of the second insulation layer 140 is naturally formed after the blanket etching. In this embodiment, the width W1 of the residual part 140' of the second insulation layer 140 parallel to the first metal layer 110 gradually decreases from a side of the residual part 140' close to the first metal layer 110 to another side of the residual part 140' away from the first metal layer 110, and this phenomenon is naturally generated after the blanket etching.

Figure 5:
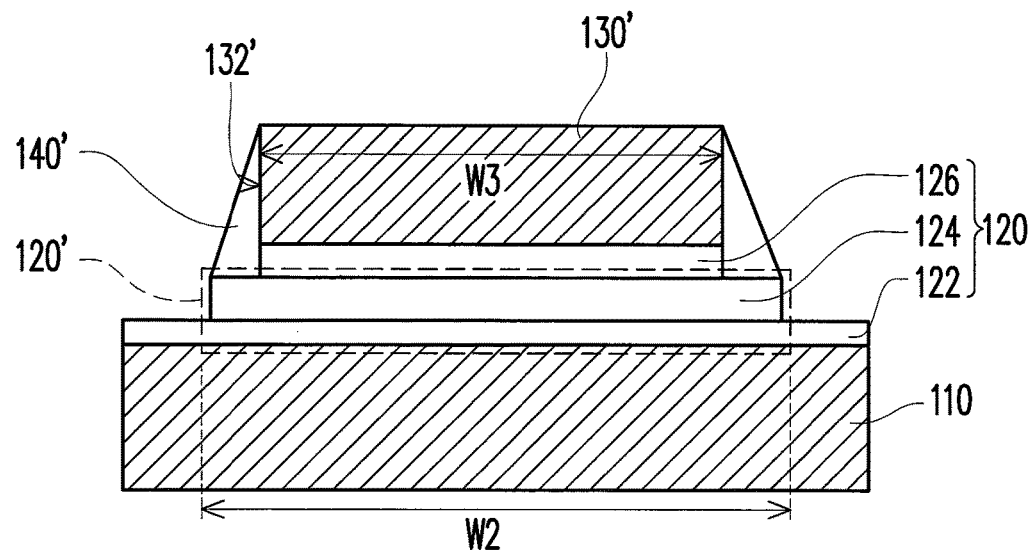
Figure 6:
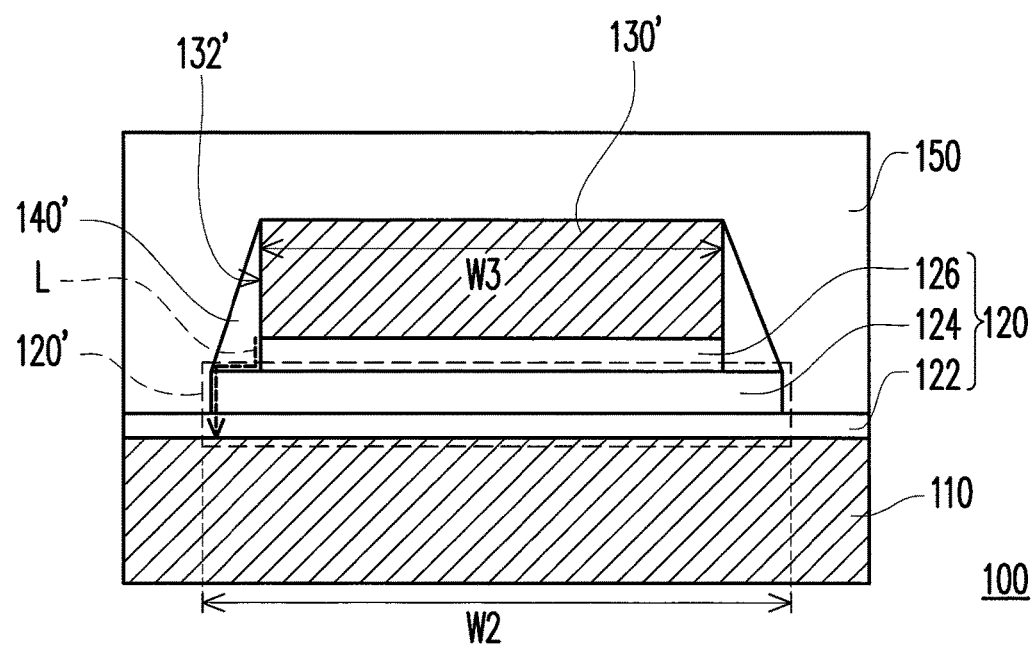

Next, referring to FIG. 5, the first insulation layer 120 is etched, wherein an intermediate part 120' of the first insulation layer 120 under the remaining part 130' of the second metal layer 130 and the residual part 140' of the second insulation layer 140 is not etched due to the remaining part 130' of the second metal layer 130 and the residual part 140' of the second insulation layer 130 serving as an etching barrier for resisting the etching of the first insulation layer 120. The width W2 of the intermediate part 120' of the first insulation layer 120 parallel to the first metal layer 110 is greater than the width W3 of the remaining part 130' of the second metal layer 130 parallel to the first metal layer 110.

In this embodiment, the manufacture method may further includes forming a third insulation layer 150 (i.e. a dielectric layer) covering the first metal layer 110, the intermediate part 120' of the first insulation layer 120, the other part of the first insulation layer 120, the residual part 140' of the second insulation layer 140 and the remaining part 130' of the second metal layer 130, and an MIM device 100 is formed. In this way, another electronic device can be formed above the MIM device 100. In this embodiment, the MIM device 100 is, for example, an MIM capacitor.

In the manufacture method of the MIM device 100 according to this embodiment, since the residual part 140' of the second insulation layer 140 is maintained on the side wall 132' of the remaining part 130' of the second metal layer 130, and since the width W2 of the intermediate part 120' of the first insulation layer 120 parallel to the first metal layer 110 is greater than the width W3 of the remaining part 130' of the second metal layer 130 parallel to the first metal layer 110, the leakage current from the edge of the remaining part 130' of the second metal layer 130 is effectively reduced, thus increasing the performance of the MIM device 100. As a result, the MIM device 100 may operate in a high voltage. Specifically, since the intermediate part 120' of the first insulation layer 120 laterally protrudes from the remaining part 130' of the second metal layer 130, the length of the conductive path of the leakage current L is increased, which increases the resistance between the remaining part 130' of the second metal layer 130 and the first metal layer 110. As a result, the leakage current is effectively reduced, thus increasing the performance of the MIM device 100.

The MIM device 100 of this embodiment includes a first metal layer 110, a first insulation layer (i.e. the first insulation layer 120 shown in FIG. 6), a second metal layer (i.e. the remaining part 130'), and a second insulation layer (i.e. the residual part 140'). The first insulation layer 120 is disposed on the first metal layer 110. The second metal layer (i.e. the remaining part 130') is disposed on a part of the first insulation layer (i.e. the first insulation layer 120 shown in FIG. 6). The second insulation layer (i.e. the residual part 140') is disposed on the side wall 132' of the second metal layer (i.e. the remaining part 130') and on another part of the first insulation layer (i.e. the first insulation layer 120 shown in FIG. 6). The width W2 of the first insulation layer under the second metal layer (i.e. the remaining part 130') and the second insulation layer (i.e. the residual part 140') parallel to the first metal layer 110 (i.e. the width W2 of the intermediate part 120' shown in FIG. 6) is greater than the with W3 of the second metal layer (i.e. the remaining part 130') parallel to the first metal layer 110. In this embodiment, the MIM device 100 further includes the third insulation layer 150. The advantage and the effect of the MIM device 100 are stated hereinbefore, and are not repeated herein.

In the manufacture method of the MIM device according to the embodiment of the invention, since the residual part of the second insulation layer is maintained on a side wall of the remaining part of the second metal layer, and since the width of the intermediate part of the first insulation layer parallel to the first metal layer is greater than the width of the remaining part of the second metal layer parallel to the first metal layer, the leakage current from the edge of the remaining part of the second metal layer is effectively reduced, thus increasing the performance of the MIM device. In the MIM device according to the embodiment of the invention, since the second insulation layer is disposed on a side wall of the second metal layer, and since the width of the first insulation layer under the second metal layer and the second insulation layer parallel to the first metal layer is greater than the width of the second metal layer parallel to the first metal layer, the leakage current from the edge of the second metal layer is effectively reduced, thus increasing the performance of the MIM device.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A metal-insulation-metal (MIM) device comprising:
a first metal layer;
a first insulation layer disposed on the first metal layer;
a second metal layer disposed on a part of the first insulation layer; and
a second insulation layer disposed on a side wall of the second metal layer and on another part of the first insulation layer;
wherein a width of the first insulation layer under the second metal layer and the second insulation layer parallel to the first metal layer is greater than a width of the second metal layer parallel to the first metal layer, wherein the first insulation layer comprising a multilayer structure, and the multilayer structure comprises a first silicon dioxide sub-layer, a second silicon dioxide sub-layer and a silicon nitride sub-layer, wherein the first silicon dioxide sub-layer is disposed between the silicon nitride sub-layer and the first metal layer, the second silicon dioxide sub-layer is disposed between the silicon nitride sub-layer and the second metal layer, and the silicon nitride sub-layer is disposed between the first silicon dioxide sub-layer and the second silicon dioxide sub-layer, wherein a width of the first silicon dioxide sub-layer parallel to the first metal layer is greater than a width of the silicon nitride sub-layer parallel to the first metal layer, and the width of the silicon nitride sub-layer parallel to the first metal layer is greater than a width of the second silicon dioxide sub-layer parallel to the first metal layer.

2. The MIM device according to claim 1 further comprising a third insulation layer covering the first metal layer, the first insulation layer, the second insulation layer and the second metal layer.

3. The MIM device according to claim 1, wherein a width of the second insulation layer parallel to the first metal layer gradually decreases from a side of the second insulation layer close to the first metal layer to another side of the second insulation layer away from the first metal layer.

4. The MIM device according to claim 1, wherein the second insulation layer is a silicon dioxide layer.

* * * * *